United States Patent
Chonan

(10) Patent No.: US 6,885,232 B2
(45) Date of Patent: Apr. 26, 2005

(54) SEMICONDUCTOR INTEGRATED CIRCUIT HAVING A FUNCTION DETERMINATION CIRCUIT

(75) Inventor: Toru Chonan, Tokyo (JP)

(73) Assignee: Elpida Memory, INC, Tokyo (JP)

( * ) Notice: Subject to any disclaimer, the term of this patent is extended or adjusted under 35 U.S.C. 154(b) by 0 days.

(21) Appl. No.: 08/696,404

(22) Filed: Aug. 14, 1996

(65) Prior Publication Data

US 2004/0212402 A1 Oct. 28, 2004

(30) Foreign Application Priority Data

Aug. 16, 1995 (JP) .............................................. 7-208884

(51) Int. Cl.[7] .......................................... H03K 18/0948
(52) U.S. Cl. ...................................... 327/313; 327/198
(58) Field of Search ................................ 327/198, 313, 327/142, 143, 78, 410, 50, 513, 530; 365/233, 194

(56) References Cited

U.S. PATENT DOCUMENTS 5,117,177 A * 5/1992 Eaton, Jr. ................... 327/537
5,353,250 A * 10/1994 McAdams ................... 327/313
5,412,333 A * 5/1995 Okunaga ..................... 327/198

* cited by examiner

*Primary Examiner*—Dinh T. Le
(74) *Attorney, Agent, or Firm*—Scully, Scott, Murphy & Presser

(57) ABSTRACT

DC voltage $V_{REF}$ produced in an LSI and having a value between power supply voltage $V_{DD}$ and the ground potential is applied to the gate electrode of pMOS transistor $Q_{P1}$ which forms a function determination circuit. Since the gate voltage of a transistor $Q_{P1}$ is lower than that in a conventional function determination circuit, current through the transistor $Q_{P1}$ is reduced. Hence, the gate length of the transistor $Q_{P1}$ can be reduced. When a second pMOS transistor is connected in parallel to the transistor $Q_{P1}$ so that the transistor has a function for supplying charge to junction A when power is fed to the LSI, the area of the transistor $Q_{P1}$ can be further reduced. When a voltage produced for a purpose other than for the function determination circuit such as a step-down power supply of the LSI is used as DC voltage, the area of the transistor can be reduced.

5 Claims, 5 Drawing Sheets

SEMICONDUCTOR INTEGRATED CIRCUIT HAVING A FUNCTION DETERMINATION CIRCUIT

BACKGROUND OF THE INVENTION

1. Field of the Invention

This invention relates to a semiconductor integrated circuit, and more particularly to a semiconductor integrated circuit of the bonding option type which includes a function determination circuit for providing a different function to the semiconductor integrated circuit in a manufacturing process depending upon whether or not a bonding pad is bonded.

2. Description of the Related Art

In recent years, it is a common practice in the manufacturing of a semiconductor integrated circuit (hereinafter referred to as LSI) to perform manufacturing processes, as it is called pre-processes, prior to the assembling of the LSI, on the same chips, following which functions of the LSI are provided using the function determination circuit in order to produce different types of LSIs at a low cost. The determination of types by such manufacturing processes as described above is called a bonding option. FIG. 1 shows a circuit diagram of a conventional function determination circuit of a bonding option of LSI. Referring to FIG. 1, the circuit shown is a function determination circuit of the ground bonding option type and includes a bonding pad 1, pMOS transistor $Q_{P1}$ interconnecting the bonding pad 1 and a power supply line (voltage=$V_{DD}$) 2 and connected at a gate electrode thereof to a ground line 3, CMOS invertor 4A having an input terminal connected to a drain electrode (junction A) of the transistor $Q_{P1}$, pMOS transistor $Q_{P2}$ whose gate electrode is connected to an output terminal (junction B) of an invertor 4A and whose drain electrode is connected to the junction A, and invertor 4B having an input terminal connected to the output terminal of the invertor 4A. In an LSI of the ground bonding option type which employs the circuit shown in FIG. 1, function determination is performed in the following manner in manufacturing processes.

First, when the bonding pad 1 is not bonded (non-bonding) to an external terminal of the LSI, electric charge is supplied from the power supply line 2 to the junction A via the transistor $Q_{P1}$ to raise voltage at the junction A. When the voltage at the junction A reaches a threshold level of the invertor 4A, the junction B is pulled down to the ground potential by the invertor 4A. Consequently, transistor $Q_{P2}$ is put into an ON-state, and the junction A is charged up to the level of power supply voltage $V_{DD}$. As a result of a sequence of operations as described above, supply of charge through the transistors $Q_{P1}$ and $Q_{P2}$ is suspended, and the output $\phi_1$ of the function determination circuit exhibits a high level (H). A signal processing circuit (not shown) on a chip acts in response to a signal $\phi_1$ of the high level, so that the LSI will be given a function which is controlled under condition of $\phi_1$=H. At the time of this non-bonding, no current consumption occurs.

Next, function determination in the case that the bonding pad 1 is bonded (ground bonding) to the external terminal 5 for grounding the LSI will be described. In this instance, charge is supplied to the junction A through transistors $Q_{P1}$ and $Q_{P2}$. However, since both the transistors have a low current capacity, voltage at junction A exhibits ground potential. Consequently, a junction B, which is an output point of invertor 4A, exhibits a power supply voltage $V_{DD}$ level, and the transistor $Q_{P2}$ is put into an OFF-state. In this instance, output $\phi_1$ of the function determination circuit exhibits a low level (L). As a result of the operations described above, this LSI will be given a function which is controlled under conditions of $\phi_1$=L. In the case of the ground bonding current always flows to the bonding pad 1 through transistor $Q_{P1}$, resulting in generation of consumption current of the function determination circuit.

It is to be noted that, from the foregoing description of operation, it can be seen that the elements which is directly related to the bonding option in the function determination circuit are the bonding pad 1 and pMOS transistor $Q_{P1}$. The circuit comprising the invertor 4A and transistor $Q_{P2}$ acts as a latch to hold the state at the junction A thereby to make the operation of the circuit surer. Meanwhile, the invertor 4B acts as a buffer for a load, that is, the signal processing circuit.

FIG. 2 is a circuit diagram of another example of a conventional function determination circuit. The circuit shown is a function determination circuit of the power supply bonding option type. Referring to FIG. 2, in the circuit shown, charge is pulled down to a ground line 3 from a bonding pad 1 (junction C) through nMOS transistors $Q_{N1}$ and $Q_{N2}$. From this, although phases of the junctions C and D are reverse to the phases in the function determination circuit of the ground bonding option type, other principles of operation are the same as in the function determination circuit of the ground bonding option type shown in FIG. 1.

In the case of the power supply bonding option, at the time of the non-bonding type, nMOS transistor $Q_{N1}$ pulls down charge from the junction C to prevent floating. Meanwhile, as well known in the art, an nMOS transistor has a current capacity of approximately twice that of a pMOS transistor if the geometrical dimensions such as channel length, channel width or gate insulating film thickness are equal between the transistors. Accordingly, if it is intended to obtain equal consumption current between function determination circuits of the power supply bonding option type and the ground bonding option type, the channel length of nMOS transistor $Q_{N1}$ must be set to twice the channel length of pMOS transistor $Q_{P1}$. In other words, the area of the transistor $Q_{N1}$ is approximately twice the area of the transistor $Q_{P1}$.

As described above, in the conventional function determination circuit shown in FIG. 1, where it is of the ground bonding type wherein the bonding pad 1 and the external grounding terminal are bonded to each other, current always flows from a power supply line 2 via transistor $Q_{P1}$, junction A to bonding pad 1, while current is consumed.

In order to reduce the current consumption, it is effective to provide a transistor $Q_{P1}$ of high resistance. In principle, the current consumption can be reduced to zero if the resistance of transistor $Q_{P1}$ is increased infinitely, or in other words, transistor $Q_{P1}$ is removed. However, if transistor $Q_{P1}$ is removed, then, in the case of non-bonding, the bonding pad 1 is put into a floating state. Even if a circuit is added to set the junction A to the level H when power is supplied, the junction A thereafter is put into a floating state. As a result, the voltage level at the junction A may possibly exceed the threshold level of the invertor 4A due to variation of the power supply voltage or noise produced in the LSI, resulting in reversal of output signal $\phi_1$ to the level L. That is, removal of transistor $Q_{P1}$ is a very risky measure since it may possibly damage the reliability of operation, and hence such measure cannot be employed in practical use.

After all, it is a realistic countermeasure to maximize the channel length of transistor $Q_{P1}$ so as to provide a high resistance in order to reduce the current consumption as far as possible within a range within which the function determination circuit can operate normally against a variation of the power supply voltage or noise. This countermeasure may, however, produce an effect that the area of the transistor $Q_{P1}$, or in other words, the area occupied by the function determination circuit increases. For example, while the current consumption of the function determination circuit is designed so as to be lower than approximately 0.5 $\mu$A, the area of transistor $Q_{P1}$ in this instance is as large as approximately 2,500 $\mu m^2$. In recent years, in order to reduce the production cost of LSIs as much as possible, number of kinds of LSIs to be produced on the same kind of chips is in an increasing tendency, and many LSIs include a large number of function determination circuits carried on one chip. For example, in an LSI wherein six function determination circuits are carried on a chip, the total area of transistors $Q_{P1}$ is as large as that of one bonding pad, and as a result, the chip area is increased significantly.

Such an increase of the chip area caused by reduction in current consumption of a function determination circuit as described above makes a more serious problem with the LSI of the power supply bonding option type shown in FIG. 2. This is due to the fact that, in the case of power supply bonding option type, the current capacity of nMOS transistor $Q_{N1}$ employed therein is as high as approximately twice the current capacity of pMOS transistor $Q_{P1}$.

SUMMARY OF THE INVENTION

Accordingly, it is an object of the present invention to provide a semiconductor integrated circuit wherein current consumption of a function determination circuit in an LSI of the bonding option type is reduced thereby to reduce the occupation area of the function determination circuit on a chip.

According to the present invention, there is provided a semiconductor integrated circuit of the bonding option type which includes, on the same chip, an original signal processing circuit and also a function determination means which acts upon the signal processing circuit to determine a function of the semiconductor integrated circuit, and wherein the function determination means is formed of a circuit including at least a bonding pad and a transistor for supplying charge from a power supply potential point to the bonding pad or for pulling down charge from the bonding pad to a ground potential point, and in a process of production, a function of the semiconductor integrated circuit is determined depending upon whether or not a terminal for connection to the outside and the bonding pad are bonded to each other, wherein a DC voltage which is produced in the semiconductor integrated circuit and has a value between a power supply voltage and a ground potential is applied to the gate electrode of the transistor which forms the function determination circuit.

The semiconductor integrated circuit is further characterized in that a second transistor for supplying charge from the power supply potential point to the bonding pad or pulling down charge from the bonding pad to the ground potential point for a predetermined period of time after power is supplied to the semiconductor integrated circuit corresponding to the supply of charge or the pulling down of charge of the transistor which forms the function determination means is connected in parallel to the transistor which forms the function determination means.

DETAILED DESCRIPTION OF THE PREFERRED EMBODIMENTS

Figure 1:
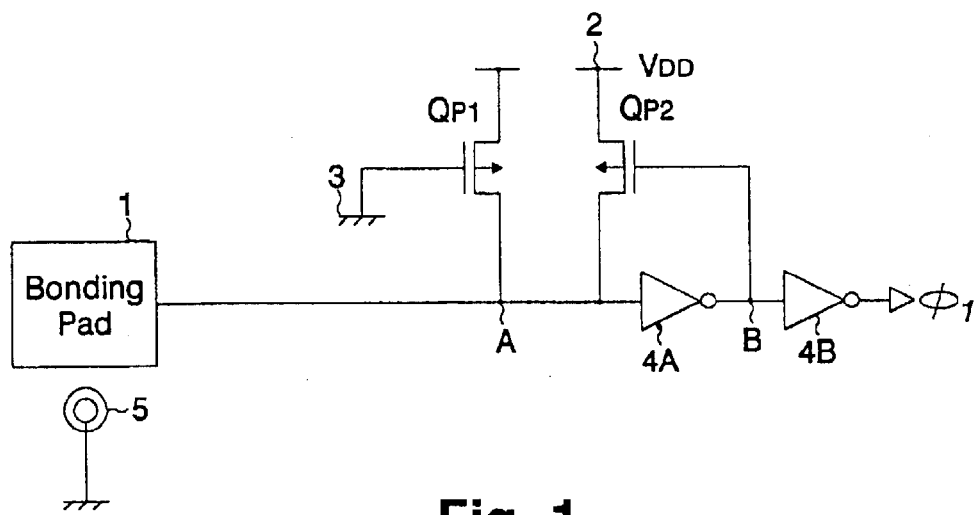
FIG. 1 is a circuit diagram of an example of a conventional function determination circuit.
Figure 2:
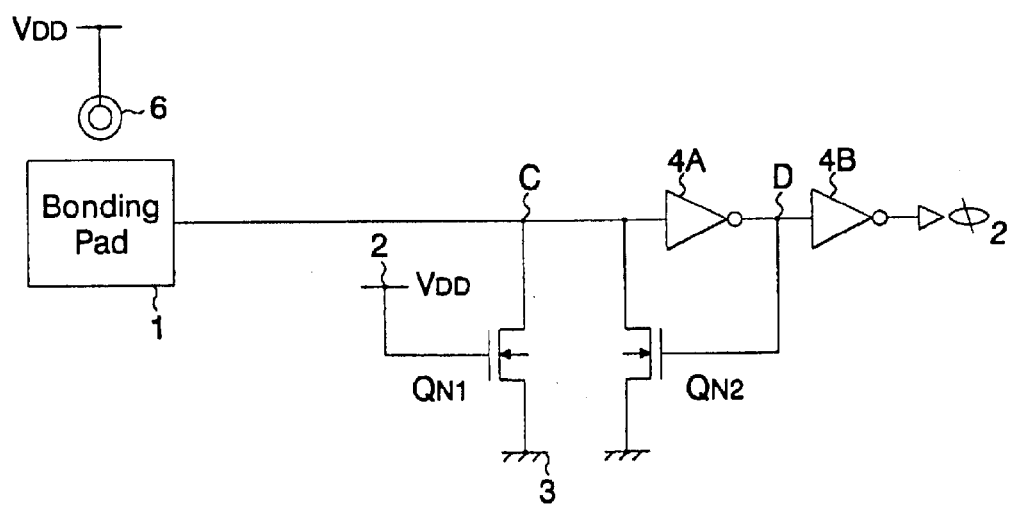
FIG. 2 is a circuit diagram of another example of a conventional function determination circuit.
Figure 3:
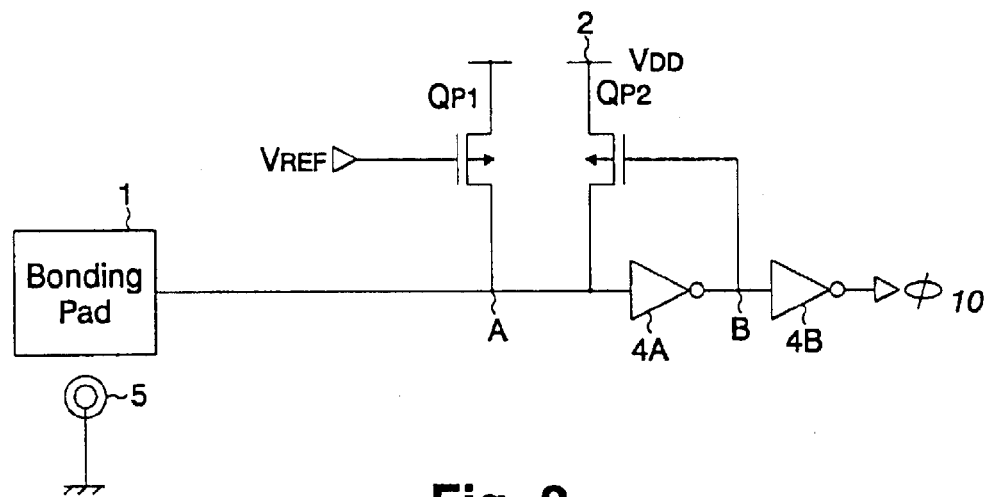
FIG. 3 is a circuit diagram of a function determination circuit according to a first embodiment of the present invention.

In the following, embodiments of the present invention are described with reference to the drawings. FIG. 3 shows a circuit diagram of a function determination circuit according to a first embodiment of the present invention. The present embodiment is a function determination circuit of the ground bonding option type. When FIGS. 3 and 1 are compared with each other, the present embodiment is different from the conventional function determination circuit in that reference voltage $V_{REF}$ generated in an LSI is applied to a gate electrode of pMOS transistor $Q_{P1}$ provided for prevention of floating of a bonding pad 1. In particular, the function determination circuit of the present embodiment includes the bonding pad 1, pMOS transistor $Q_{P1}$ whose drain electrode is connected to the bonding pad 1 and whose source electrode is connected to a power supply line 2, CMOS invertor 4A having an input terminal connected to the drain electrode (junction A) of the transistor $Q_{P1}$ pMOS transistor $Q_{P2}$ which interconnects a power supply line 2 and the junction A to form a current path therebetween and whose gate electrode is connected to an output terminal of the invertor 4A, and CMOS invertor 4B having an input terminal connected to the output terminal of the invertor 4A. An output signal $\phi_{10}$ to a signal processing circuit (not shown) in the LSI is extracted from the output terminal of an invertor 4B. A DC reference voltage $V_{REF}$ is inputted into the gate electrode of the transistor $Q_{P1}$. This reference voltage $V_{REF}$ is lower than a power supply voltage $V_{DD}$ and satisfies $V_{DD}-V_{REF}>V_T(Q_{P1})$ (where $V_{T(QP1)}$ is a threshold voltage of (pMOS transistor $Q_{P1}$).

Now, in the case that the bonding pad 1 is not bonded (non-bonding) to an external terminal of the LSI, DC voltage $V_{REF}$ is applied to the gate electrode of the transistor $Q_{P1}$ to put the transistor $Q_{P1}$ into an ON-state so that electric charge is supplied to the junction A, whereupon the voltage at the junction A rises and when the voltage at the junction A exceeds a threshold level of an invertor 4A, the invertor 4A pulls down junction B to the ground potential. Consequently, a transistor $Q_{P2}$ is put into an ON-state, and the junction A is charged up to a power source voltage $V_{DD}$. As a result of a series of the operations described above, supply of charge to the transistor $Q_{P1}$ is suspended. In this instance, a signal $\phi_{10}$ supplied from the output terminal of the invertor 4B to a signal processing circuit in the LSI exhibits $\phi_{10}$=H, so that, the LSI acts as an LSI having a function controlled under condition of $\phi_{10}$=H. No current is consumed in the function determination circuit at the time of the non-bonding.

Next, a ground bonding wherein the bonding pad 1 is bonded to an external terminal 5 for grounding will be described. In this case, electric charge is supplied to the junction A through the transistors $Q_{P1}$ and $Q_{P2}$. However, since those transistors have a low current capacity, the voltage at the junction A exhibits a ground potential. Consequently, the junction B which is the output point of the invertor 4A exhibits the level of power source voltage $V_{DD}$ and the transistor $Q_{P2}$ is put into an OFF-state. In this instance, the output $\phi_{10}$ of the function determination circuit is in the state of $\phi_{10}$=L. As a result of a series of operations described above, the LSI has a function controlled at $\phi_{10}$=L. In the case of the ground bonding, currents always flow from the transistor $Q_{P1}$ to the bonding pad 1, which currents are consumption currents of the function determination circuit.

Here, the magnitude of consumption current flowing through the function determination circuit at the time of the ground bonding is compared between the present embodiment and the prior art shown in FIG. 1. In the conventional function determination circuit, the gate voltage of transistor $Q_{P1}$ is at a ground potential, and hence, the transistor $Q_{P1}$ operates in a saturated region. Therefore, the consumption current of the function determination circuit, that is, the current flowing through the transistor $Q_{P1}$ is proportional to $(V_{DD}-V_{T(QP1)})^2$. In contrast, in the present embodiment, the gate voltage of the transistor $Q_{P1}$ is $V_{REF}$, and the consumption current is proportional to $(V_{DD}-V_{REF}-V_{T(QP1)})^2$. Hence, when the consumption current is made equal between the conventional function determination circuit and the present embodiment, the channel length of the transistor $Q_{P1}$ in the present embodiment becomes $(V_{DD}-V_{REF}-V_{T(QP1)})^2/(V_{DD}-V_{T(QP1)})^2$ times the channel length of the transistor $Q_{P1}$ of the conventional function determination circuit. For example, power source voltage $V_{DD}$=3.3 V, DC reference voltage $V_{REF}$=2.0 V and threshold voltage $V_{T(QP1)}$ of the transistor $Q_{P1}$=0.8 V, the value mentioned above is 0.04. The area of the transistor $Q_{P1}$ in the present embodiment is only 4% that of the conventional function determination circuit.

DC reference voltage $V_{REF}$ needs only to be lower than $V_{DD}-V_{T(QP1)}$, and a DC voltage such as, for example, a reference voltage of a step-down power supply circuit provided in an LSI can be used as a DC reference voltage $V_{REF}$. In this manner, the function determination circuit may not need any area for providing an exclusive voltage generation circuit for the function determination circuit. Or, in order to control consumption currents more precisely, such a voltage generation circuit as shown, for example, in a circuit diagram of FIG. 4 may be used.

Figure 4:
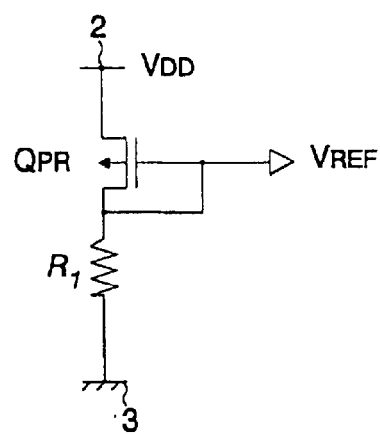
FIG. 4 is a circuit diagram of an example of a dc voltage generation circuit which is employed in the first embodiment and a second embodiment.

FIG. 4 is a circuit diagram of a reference voltage $V_{REF}$ generation circuit. Referring to FIG. 4, the voltage generation circuit shown includes a pMOS transistor $Q_{PR}$, comprising a diode connection in which a gate electrode and a drain electrode being connected to each other, and a resistance element R1, between a ground line 2 and power source line 3. Reference voltage $V_{REF}$ is taken out from a common gate-drain electrode of the transistor $Q_{PR}$. In the voltage generation circuit, if the resistance value of the resistance element R1 is increased sufficiently, then $V_{REF} \approx V_{DD}-V_{T(QP1)}$. Consequently, the current capacity of the transistor $Q_{P1}$ of the function determination circuit can be reduced to a minimum, and the area of the transistor $Q_{P1}$ and occupation area of the function determination circuit can be minimized.

Figure 5A:
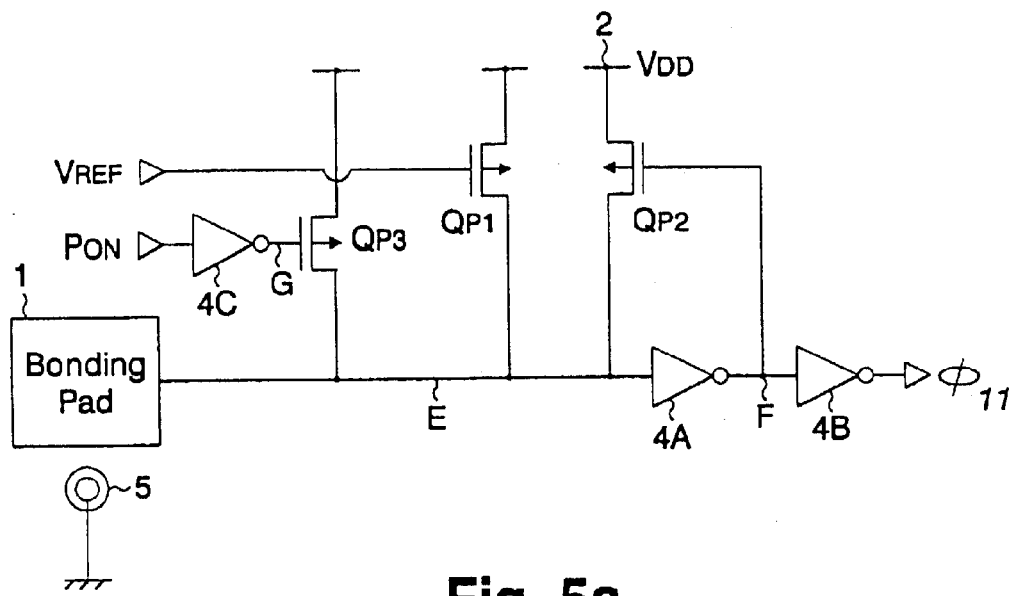
FIG. 5a is a circuit diagram of a function determination circuit according to the second embodiment of the present invention.
Figure 5B:
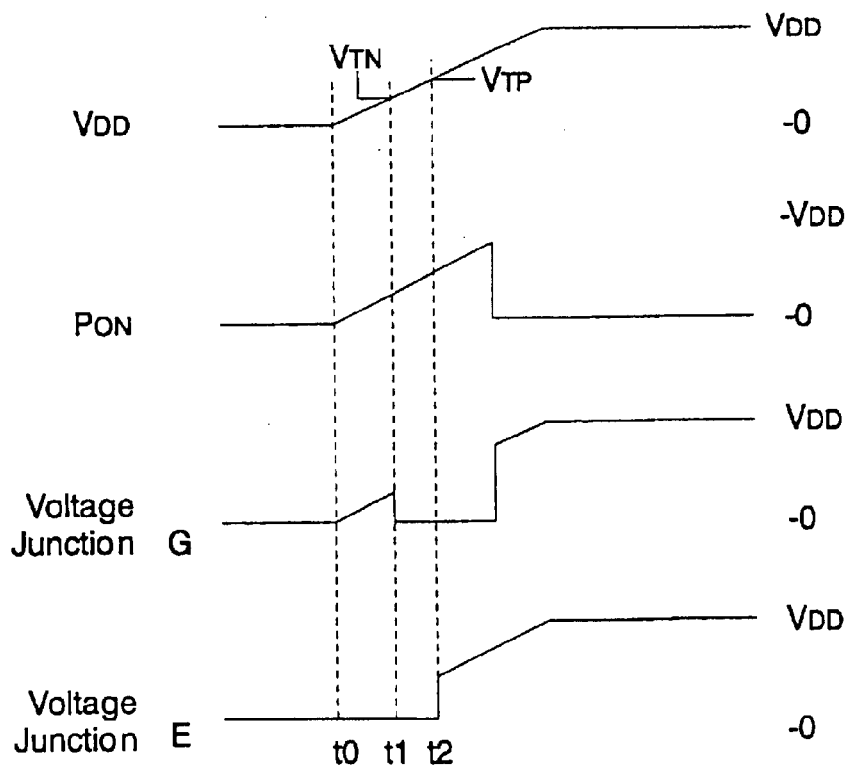
FIG. 5b is a time chart of the function determination circuit of FIG. 5a when power is made available.

Next, a second embodiment of the present invention will be described. The embodiment whose circuit diagram is shown in FIG. 5(a) has an advantage, in comparison with the first embodiment, that the stability of the operation of the LSI when power is supplied is raised so that the current capacity of the transistor $Q_{P1}$ can be further reduced. FIG. 5(b) shows a time chart of the embodiment when power is supplied. Referring to FIG. 5(a), the present embodiment is different from the first embodiment in that a pMOS transistor $Q_{P3}$ is provided between a power supply line 2 and a ground line 3, that is, in parallel to a transistor $Q_{P1}$. A power-on signal $P_{ON}$ generated in the LSI is inputted into a gate electrode of a transistor $Q_{P3}$ after it is inverted by an invertor 4C. The power-on signal $P_{ON}$ is a signal which can be generally used in LSI. As its waveforms are shown in FIG. 5(b), the signal, as a control signal, rises to a high level H ($V_{DD}$) to effect initialization of LSI after the elapse of a predetermined time after the energization of LSI.

Referring to FIG. 5(b), it is assumed that the function determination circuit is in a non-bonding condition. If the LSI is energized at time $t_0$, then the power-on signal $P_{ON}$ rises substantially following up voltage $V_{DD}$ until the power source voltage $V_{DD}$ reaches a certain voltage. If $V_{DD}$>$V_{TN}$ (where $V_{TN}$ is a threshold voltage of an nMOS transistor which forms the LSI) is established at time $t_1$, then the nMOS transistor of the invertor 4C is put into an On-state, whereupon the gate electrode (junction G) of the transistor $Q_{P3}$ is pulled down to the ground potential. Further, when the power source voltage reaches $V_{DD}$>$V_{TP}$ (where $V_{TP}$ is a threshold voltage of a pMOS transistor which forms the LSI) at time $t_2$, transistor $Q_{P3}$ is put into an On-state so that bonding pad 1 (junction E) is pulled up to the level of power source voltage $V_{DD}$. As a result, the potential at a junction F is reduced to the ground potential by an invertor 4A, and consequently, a pMOS transistor $Q_{P2}$ is put into an On-state and supplies charge to the junction E. As a result of a sequence of operations described, even if the power-on signal stops and $P_{ON}$=L (low level) is reached before the power source voltage $V_{DD}$ rises to a predetermined voltage which is exhibited in a steady condition, the junction E keeps a level $V_{DD}$ and outputs an output signal $\phi_{11}$=H.

Generally, the pMOS transistor $Q_{P1}$ has only a very small current capacity in order to reduce the consumption current of the function determination circuit. Therefore, if an attempt is made to raise the potential at the junction E to the level of power source voltage $V_{DD}$ only by means of the transistor $Q_{P1}$ when power is supplied, then the time constant may possibly be so high that the LSI starts its operation before output signal $\phi_{11}$ reaches H. In other words, in order to prevent this, the current capacity of transistor $Q_{P1}$ cannot be reduced so much. In contrast, in the present embodiment, since such a problem at the time of power supply can be avoided by means of transistor $Q_{P3}$ provided newly, the current capacity of transistor $Q_{P1}$ can be reduced to a possibly lowest level at which the function determination circuit is not caused to malfunction by the variation of the power source voltage or noise. In the conventional function determination circuit, even if a transistor $Q_{P3}$ for making sure an operation at the time of power supply is provided, if an attempt is made to reduce the current capacity of transistor $Q_{P1}$, then its area largely increases, and hence, the area restrains the reduction of the current consumption. In the present embodiment, since the problem due to the area is negligible, the current consumption can be suppressed to a minimum. Also in the present embodiment, a DC voltage produced for another purpose in an LSI can be used as a reference voltage $V_{REF}$. And it is also possible to use an output voltage of the voltage generation circuit shown in FIG. 4.

Figure 6:
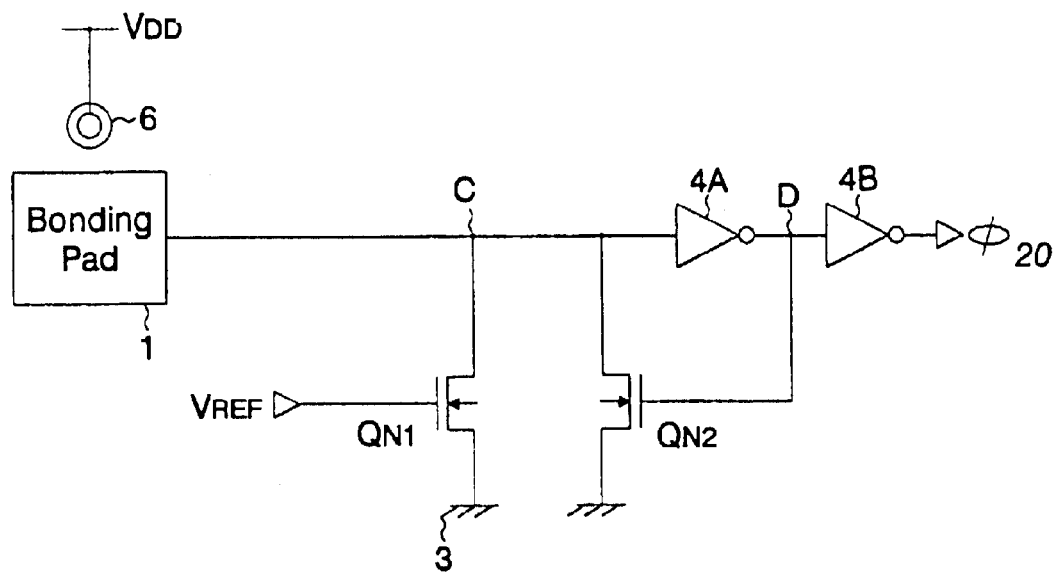
FIG. 6 is a circuit diagram of a function determination circuit according to a third embodiment of the present invention.

Next, a circuit shown in FIG. 6 is a function determination circuit of the power supply bonding-option type of a third embodiment of the present invention. The present embodiment operates based on the same principle of operation as the first embodiment except that charge of bonding pad 1 is pulled down to a ground line 3 via a nMOS transistor $Q_{N1}$, corresponding to which the phases at junctions C and D are reversed. The requirement for DC reference voltage $V_{REF}$ in the present embodiment is, because a transistor $Q_{N3}$ is an n-channel type MOS transistor, $V_{REF} > V_{T(QN1)}$ (where $V_{T(QN1)}$ is a threshold voltage of nMOS transistor $Q_{N1}$). In the same conditions as in the first embodiment, that is, when $V_{DD}=3.3$ V, $V_{REF}=2.0$ V and $V_{T(QN1)}=0.8$ V, the gate length of the transistor $Q_{N1}$ required to obtain the same current consumption as the conventional function determination circuit of the power supply bonding option type is $(V_{REF}-V_{T(QN1)})^2/(V_{DD}-V_{T(QN1)})^2=0.23$, that is, 23% of the conventional function determination circuit.

Figure 7:
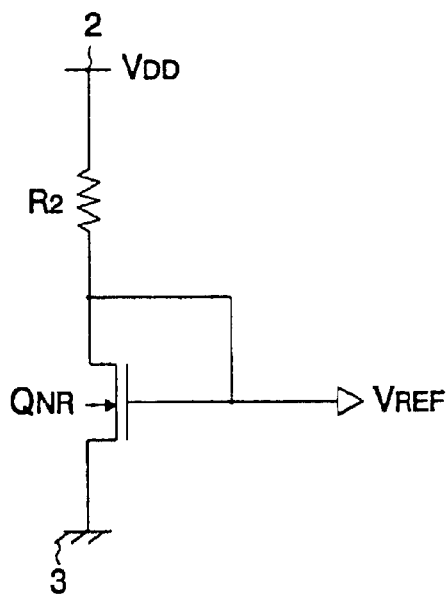
FIG. 7 is a circuit diagram of an example of the dc voltage generation circuit which is employed in the third embodiment and a fourth embodiment.

Also in the present embodiment, a voltage produced for another purpose, such as a voltage for use in a step-down power source can be used as a reference voltage $V_{REF}$ similarly to the first embodiment. Further, it is also possible to use a voltage generation circuit shown in the circuit diagram of FIG. 7 to further reduce the area of transistor $Q_{N1}$. That is, referring to FIG. 7, the voltage generation circuit shown includes a resistance element $R_2$ and a nMOS transistor $Q_{NR}$, which has a diode connection of a gate electrode and a drain electrode connected to each other, between a power supply line 2 and a ground line 3. A reference voltage $V_{REF}$ is extracted from a common gate-drain electrode of the transistor $Q_{NR}$. In the present voltage generation circuit, if the resistance value of the resistance element $R_2$ is set to a sufficiently high value, then $V_{REF} \approx V_{T(QN1)}$ can be established, and hence the current capacity of the transistor $Q_{N1}$ can be minimized. Consequently, the area of the transistor $Q_{N1}$ and occupation area of the function determination circuit can be minimized.

Figure 8A:
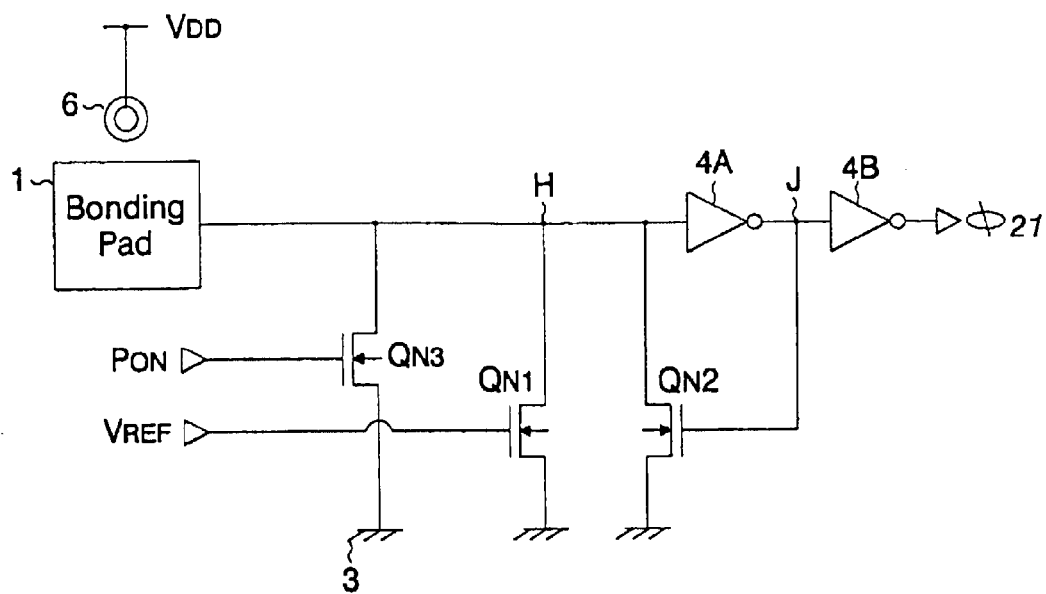
FIG. 8a is a circuit diagram of a function determination circuit according to the fourth embodiment of the present invention.
Figure 8B:
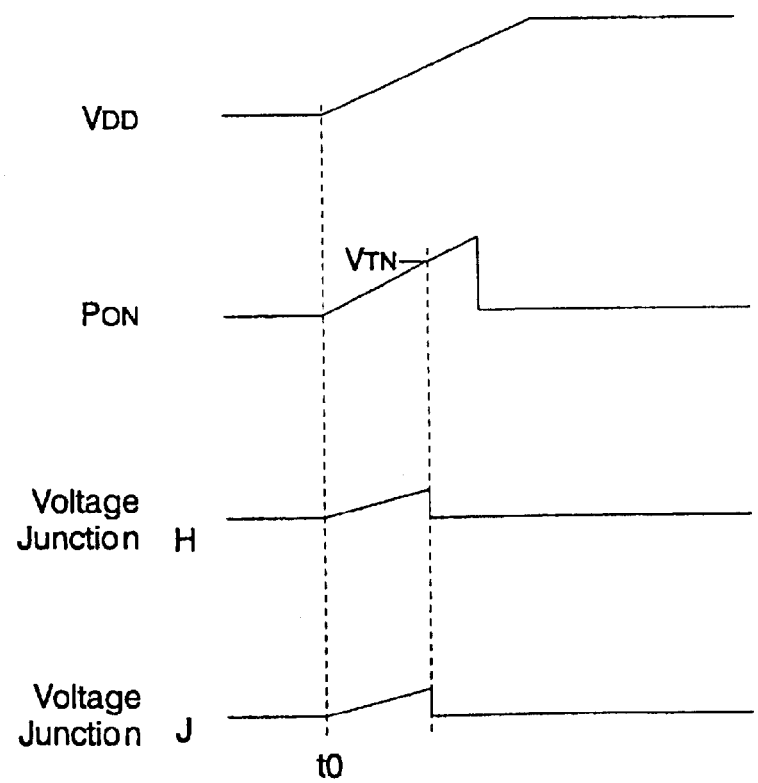
FIG. 8b is a time chart of the function determination circuit of FIG. 8a when power is made available.

Next, the circuit shown in FIG. 8(a) is a function determination circuit of the power supply bonding-option type of a fourth embodiment of the present invention. The present embodiment operates based on the same principle of operation as that of the second embodiment except that electric charge of a bonding pad 1 is pulled down to a ground line 3 via a nMOS transistor $Q_{N1}$, corresponding to which, the phases at the junctions are reversed. Thus, the operation of the LSI when power is supplied can be made sure and the area of the transistor $Q_{N1}$ can be further reduced. In the present embodiment also, a DC voltage produced for another purpose in the LSI can be used as a reference voltage $V_{REF}$, and it is also possible to use an output voltage of the voltage generation circuit shown in FIG. 7.

As described above, according to the present invention, a semiconductor integrated circuit is constructed such that it comprises a function determination circuit at least including a bonding pad and a transistor for supplying electric charge from a power source potential point to the bonding pad or pulling down the charge from the bonding pad to a ground potential point and determines, in a process of production, a function of the LSI depending upon whether or not a terminal for connection to the outside and the bonding pad are bonded to each other and that a DC voltage produced in the LSI and having a value between a power source voltage and a ground potential is applied to the gate electrode of the transistor which forms the function determination circuit. Consequently, according to the present invention, the current flowing to the transistor of the function determination circuit when the bonding pad and the external terminal are connected to each other can be reduced to thereby reduce the area of the transistor.

Further, according to the present invention, the LSI is constructed such that a second transistor for supplying charge from the power source potential point to the bonding pad or pulling down charge from the bonding pad to the ground potential point for a predetermined period of time after power to the LSI is made available is connected in parallel to the transistor of the function determination circuit. Consequently, the operation when power is made available can be made sure and the current capacity of the transistor of the function determination circuit can be further reduced thereby to reduce the area of the transistor.

If, in the LSI described above, a voltage of the drain electrode of a p-channel MOS transistor of a diode connection of a circuit which includes the pMOS transistor whose gate electrode and drain electrode are short-circuited and whose source electrode is connected to the power supply potential point and a resistor element connected between the drain electrode of the MOS transistor and the ground potential point is applied as the DC voltage to be applied to the gate electrode of the transistor of the function determination circuit, the power consumption of the function determination circuit can be further reduced.

As a DC voltage to be applied to the gate electrode of the transistor of the function determination circuit, a voltage of the drain electrode of an n-channel MOS transistor of a diode connection of a circuit which includes the MOS transistor whose gate electrode and drain electrode are short-circuited and whose source electrode is connected to the ground potential point and a resistor element connected between the drain electrode of the MOS transistor and the power supply potential point may be applied.

What is claimed is:

1. A semiconductor integrated circuit including a first voltage line, a second voltage line, and a function determination circuit, said semiconductor integrated circuit being functionally determined by an output signal of said function determination circuit, said function determination circuit comprising:

a bonding pad connectable to said second voltage line, an output node connected to said bonding pad which supplies said output signal to a signal processing circuit in said semiconductor integrated circuit to determine the function of said semiconductor integrated circuit, and a first transistor having a source-drain path connected between said first voltage line and said output node and a gate supplied with a reference voltage, wherein said reference voltage is substantially equal to a power supply voltage minus a threshold voltage of said first transistor so as to maintain the transistor in a just on state or out of saturation to decrease the current consumption of the semiconductor integrated circuit thereby to reduce an occupation area of the function determination circuit.

2. The circuit as claimed in claim 1, wherein said first voltage line supplies said power supply voltage, said second voltage line is connected to a ground potential, and said first transistor is p-channel field effect type.

3. The circuit as claimed in claim 1, said semiconductor circuit further includes a reference voltage generation circuit for supplying said reference voltage, said reference voltage circuit comprises a first node connected to said gate of said first transistor, a second transistor and a resistor, a gate and a drain of said second transistor connected to said first node, a source of said second transistor connected to said first voltage line, and said resistor connected between said drain of said second transistor and said second voltage line.

4. The circuit as claimed in claim 1, wherein said first voltage line is connected to a ground potential, said second voltage line supplies said power supply voltage, and said first transistor is n-channel type.

5. The circuit as defined in claim 1, wherein said function determination circuit further comprises a third transistor having a source-drain path connected between said first voltage line and said output node, and a gate supplied by a control signal, wherein said control signal maintains a first logic level during a predetermined period after an energization of said semiconductor circuit, and wherein said third transistor supplies a potential of said first voltage line to said output node in response to said first logic level of said control signal.

* * * * *